United States Patent [19]

Kukowski et al.

[11] Patent Number: 4,507,862
[45] Date of Patent: Apr. 2, 1985

[54] METHOD AND APPARATUS FOR HIGH SPEED TRANSFER AND INSERTION OF ELECTRICAL COMPONENTS

[75] Inventors: John A. Kukowski, Johnson City, N.Y.; Henry J. Soth, Brackney, Pa.; William H. Gay, Endicott, N.Y.

[73] Assignee: Universal Instruments Corporation, Binghamton, N.Y.

[21] Appl. No.: 470,727

[22] Filed: Feb. 28, 1983

[51] Int. Cl.³ .............. H05K 3/30; B23P 19/00; B65H 1/00; B65G 00/00
[52] U.S. Cl. .............................. 29/837; 29/741; 414/226; 414/223; 414/786; 227/115; 227/116
[58] Field of Search .............. 29/741, 739, 837, 564.6; 227/116, 115; 414/225, 749, 751

[56] References Cited

U.S. PATENT DOCUMENTS

| | | | |
|---|---|---|---|
| 2,869,130 | 1/1959 | Newton et al. | 227/116 |
| 3,516,141 | 6/1970 | Rech | 227/115 |
| 4,054,988 | 10/1977 | Masuzima et al. | 29/564.6 |
| 4,294,000 | 10/1981 | Takahashi et al. | 29/741 X |
| 4,320,574 | 3/1982 | Harigane et al. | 29/564.6 X |
| 4,403,390 | 9/1983 | Woodman, Jr. | 29/741 X |

Primary Examiner—Howard N. Goldberg
Assistant Examiner—Carl J. Arbes
Attorney, Agent, or Firm—Fidelman, Wolffe & Waldron

[57] ABSTRACT

Under direction of a machine controller, conveyor mounted clips sequentially present electrical components to an unload station while holding the components by their leads, and the components are centered relative to a loader assembly by lateral displacement of the clip relative to a loader axis. Thereafter, a loader assembly clamps the leads of the component and transfers the component to a load station and into engagement with the jaws of an insertion head. The loader assembly is then actuated to drive the leads of the component into the jaws of the insertion head for subsequent insertion of the leads into holes of a printed circuit board. The component, gripped in the jaws of the insert head, is oriented about an insert axis, according to a controller and prior to insertion. Having inserted a component into a circuit board, the tooling assembly of the insertion head is designed to withdraw from the inserted component with a minimal amount of clearance needed between the inserted component and a previously inserted component.

14 Claims, 21 Drawing Figures

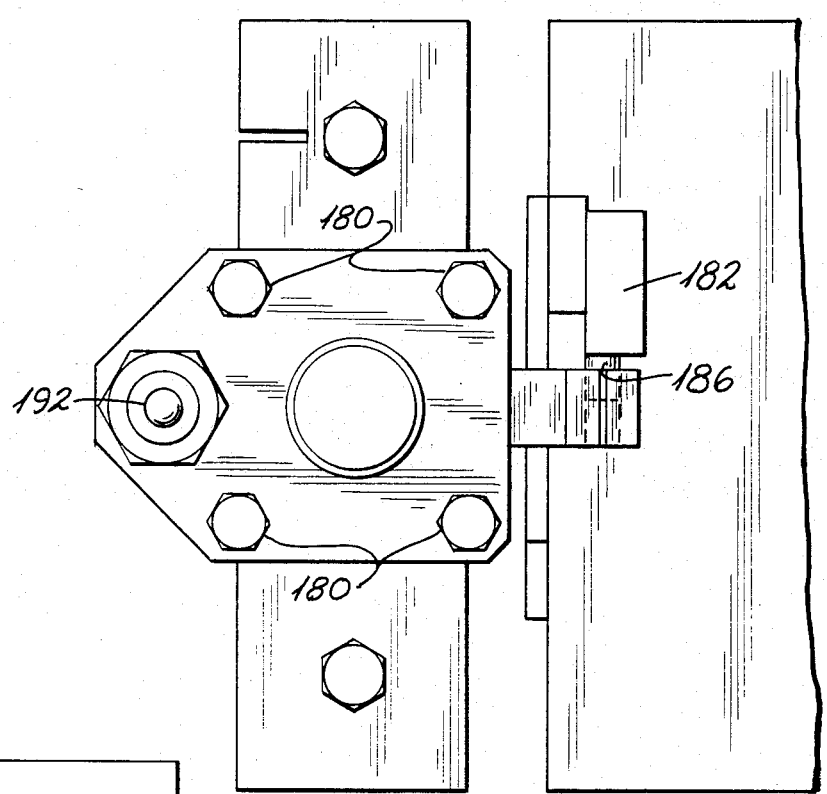
Fig. 4
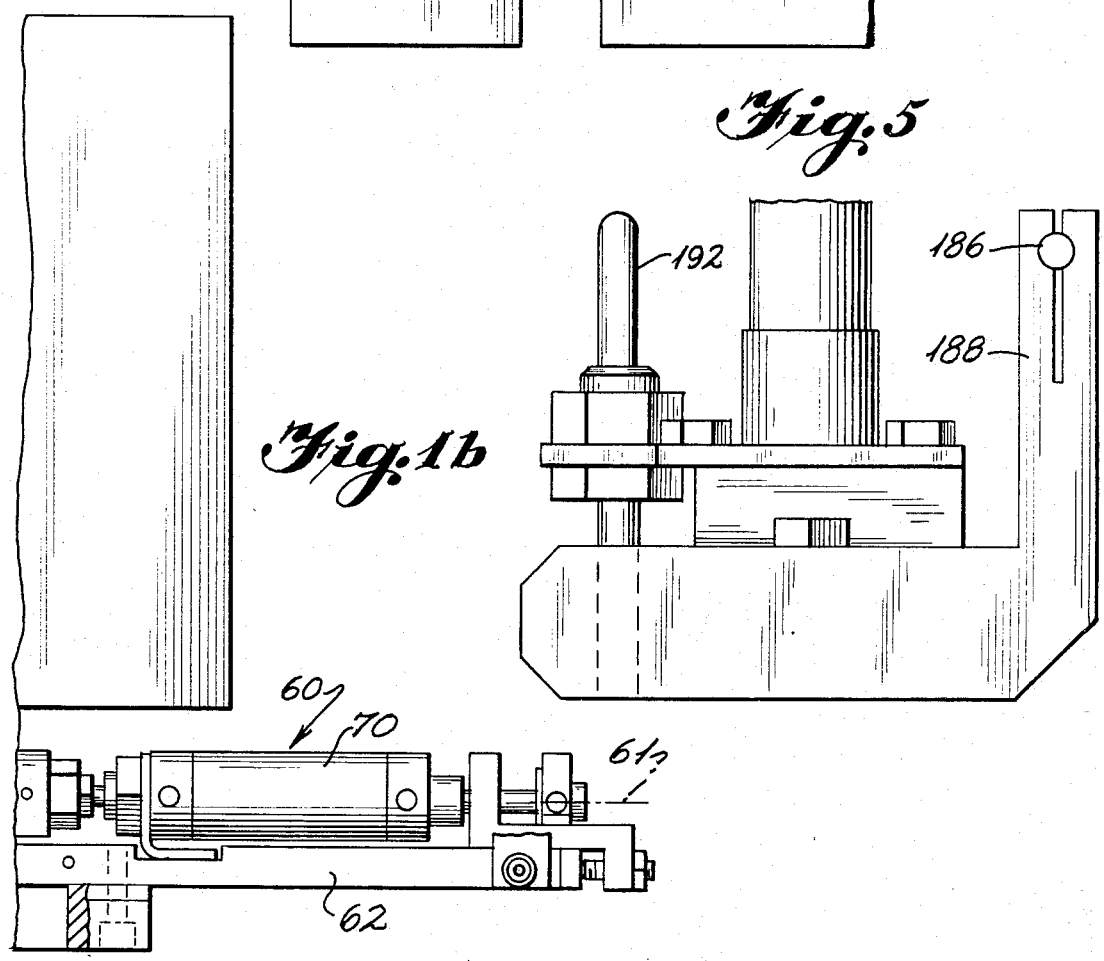
Fig. 5
Fig. 1b

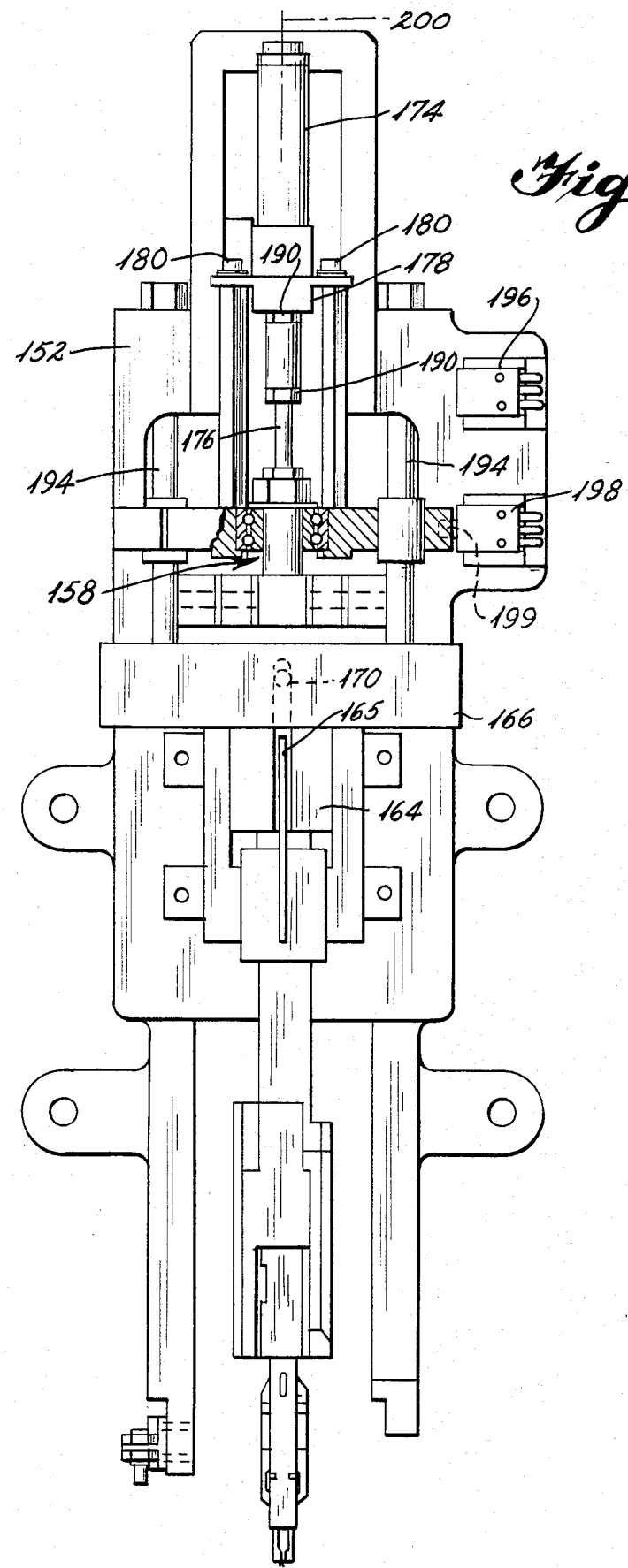

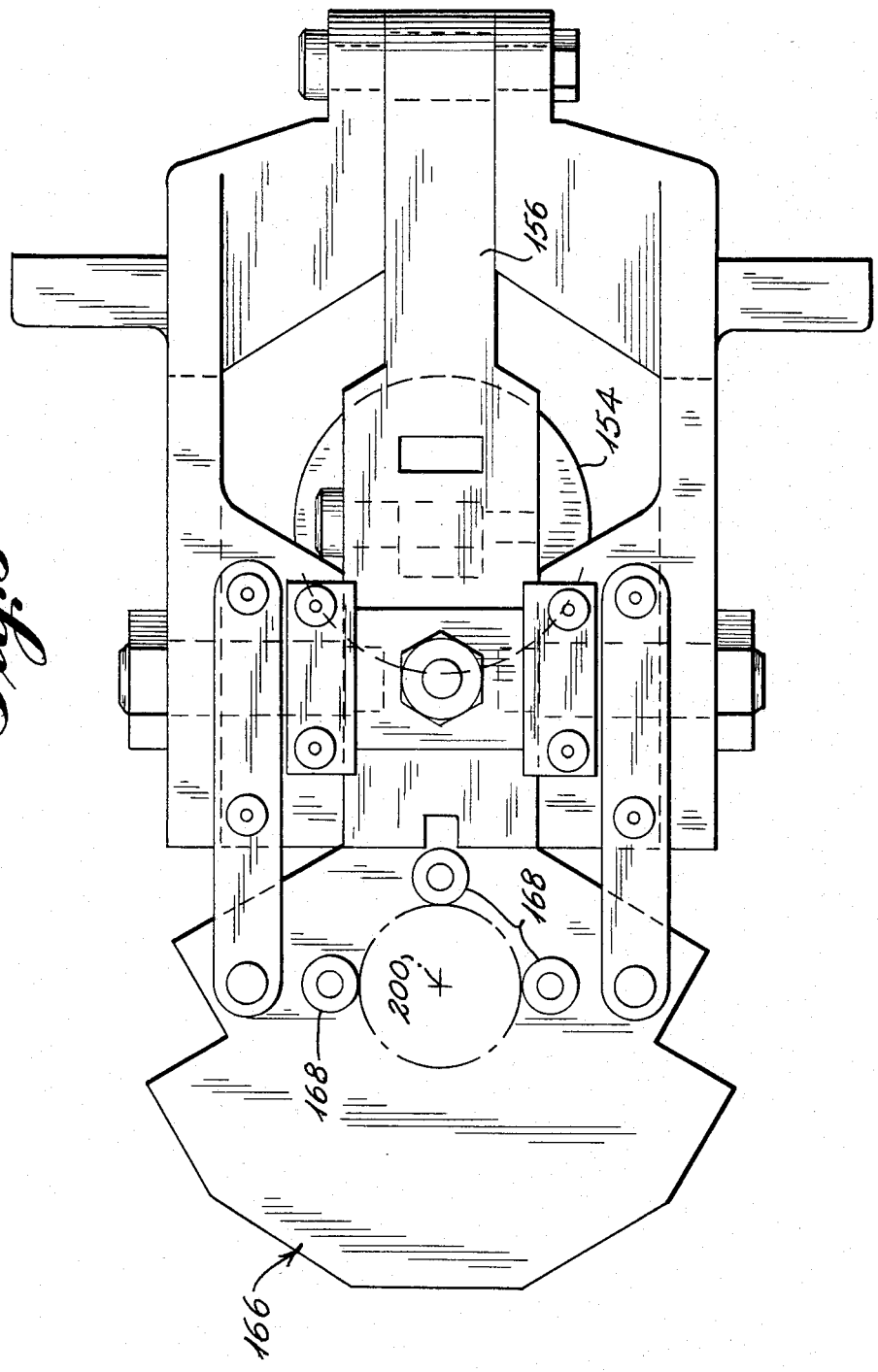

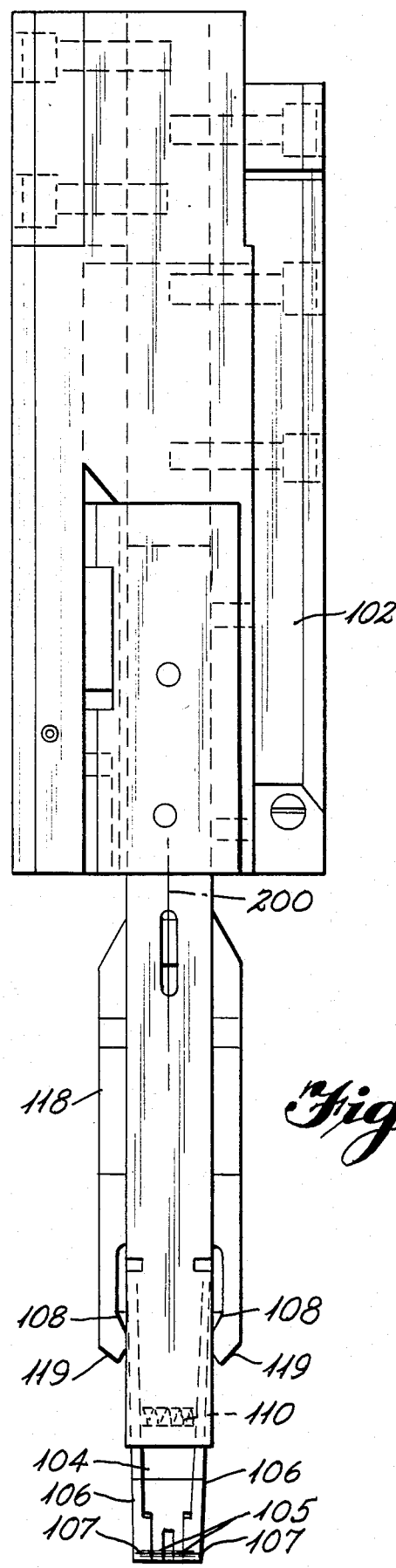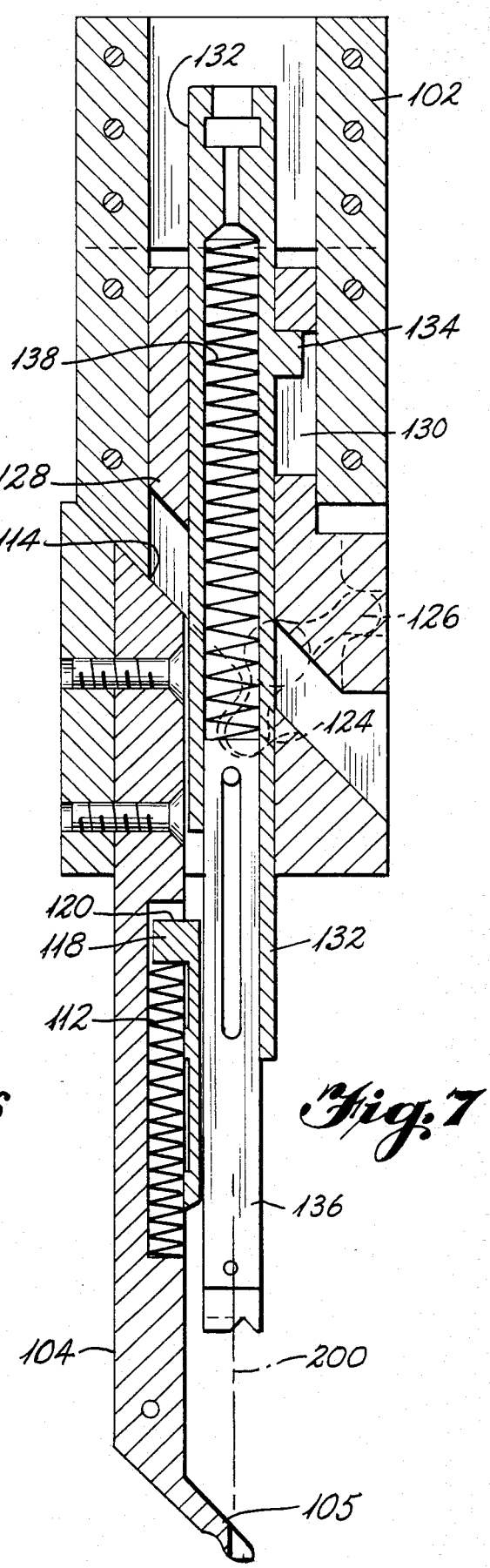

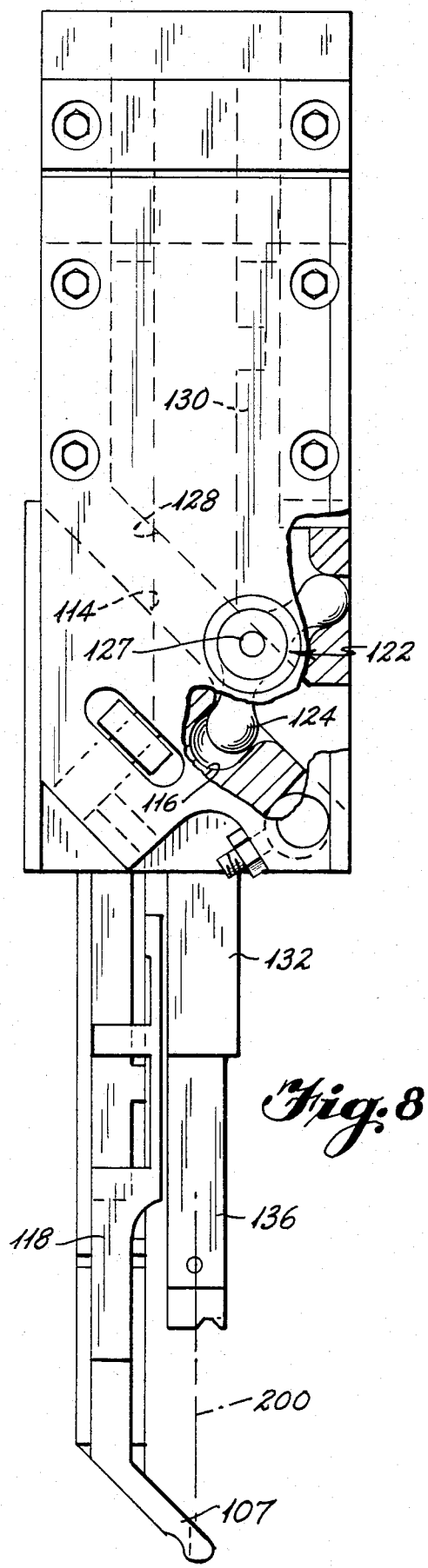
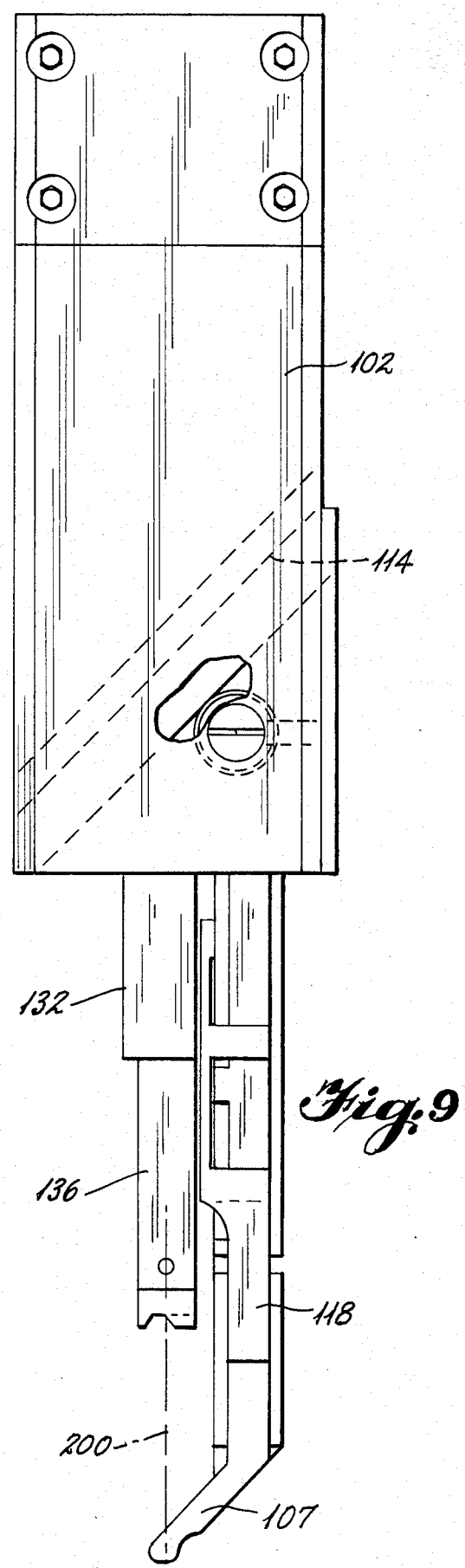

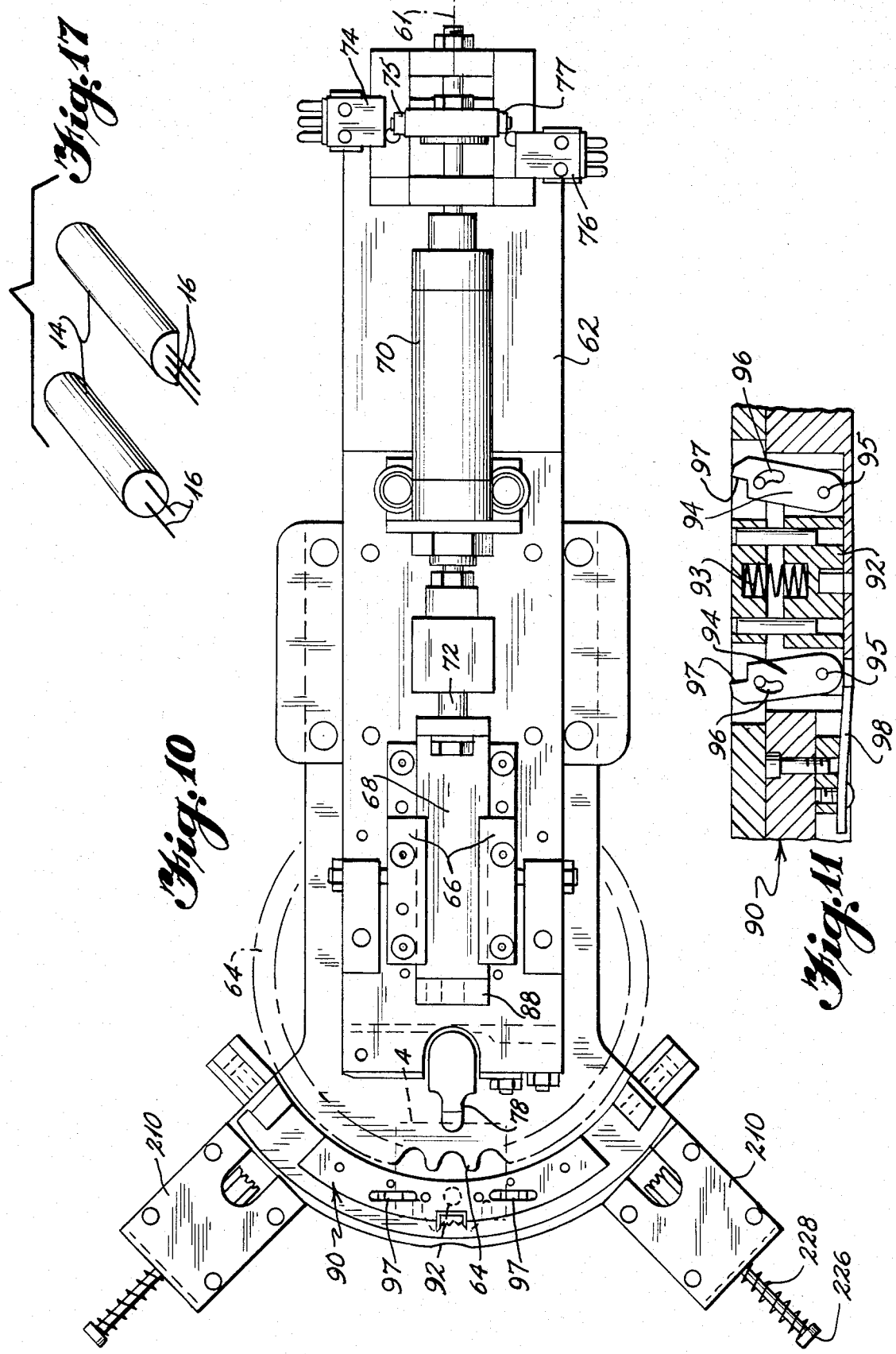

METHOD AND APPARATUS FOR HIGH SPEED TRANSFER AND INSERTION OF ELECTRICAL COMPONENTS

CROSS REFERENCES TO RELATED ART

U.S. Pat. No. 4,343,589—LINEAR LOADER FOR HIGH SPEED RADIAL LEAD COMPONENT SEQUENCING AND INSERTING MACHINE—Snyder, et al., Issued Aug. 10, 1982.

U.S. Application Ser. No. 141,608—INSERTION HEAD FOR HIGH SPEED RADIAL LEAD COMPONENT SEQUENCING AND INSERTING MACHINE—Snyder, et al., Filed Apr. 18, 1980 now Pat. No. 4,403,726, issued Sept. 13, 1983.

U.S. Pat. No. 4,356,949—ROTARY TRANSFER ASSEMBLY FOR HIGH SPEED RADIAL LEAD COMPONENT SEQUENCING AND INSERTION MACHINE—Snyder, et al., Issued Nov. 2, 1982.

U.S. Application Ser. No. 141,306—HIGH SPEED RADIAL LEAD COMPONENT SEQUENCING AND INSERTING MACHINE—Snyder, et al., Filed Apr. 18, 1980 now Pat. No. 4,398,658, issued Aug. 16, 1983.

BACKGROUND AND SUMMARY OF THE INVENTION

This invention relates to a method and apparatus for use in the automated processing of parts having a body and members depending therefrom. In particular, the method and apparatus of the instant invention are particularly adaptable to the type of machine disclosed in the above cross references to the prior art.

Prior art, high speed electrical component sequencing and inserting machines have been designed for population of printed circuit boards at a rate of approximately 7,000 electrical components per hour. A machine for achieving such speeds is inherently complex and involves many different interacting parts. Proper interaction of all the parts in the machine is dependent upon the manufacturing tolerances of those parts, with such tolerances often being additive and changeable due to the wear and tear on the machine during constant operation thereof. In fact, it is often necessary to sacrifice speed and populate circuit boards at a reduced rate (e.i., 6,500) to keep the machine running efficiently.

Accordingly, there is a constant effort to produce a simpler machine having less moving parts, hence, less down time, which will operate at the same or greater speeds.

An object of the instant invention is to provide an improved high speed electrical component processing machine which can attain and surpass the processing rates of prior art machines while having less moving parts and, hence, less down time resulting therefrom.

In addition to increasing the rate of population of circuit boards, the industry is constantly attempting to more densely populate a particular circuit board with numerous electrical components; and it is a further object of this invention to provide an apparatus which reduces the clearances needed for insertion of adjacent components on a circuit board.

These and other objects of the invention will in part be obvious and will in part appear hereinafter.

Under direction of a machine controller, conveyor mounted clips sequentially present electrical components to an unload station while holding the components by their leads, and the components are centered relative to a loader assembly by lateral displacement of the clip relative to a loader axis. Thereafter, a loader assembly clamps the leads of the component and transfers the component to a load station and into engagement with the jaws of an insertion head. The loader assembly is then actuated to drive the leads of the component into the jaws of the insertion head for subsequent insertion of the leads into holes of a printed circuit board. The component, gripped in the jaws of the insert head, is oriented about an insert axis, according to a controller and prior to insertion. Having inserted a component into a circuit board, the tooling assembly of the insertion head is designed to withdraw from the inserted component with a minimal amount of clearance needed between the inserted component and a previously inserted component.

The invention accordingly comprises the several steps and the relation of one or more of such steps with respect to the others, as well as the apparatus embodying features of construction, combination of elements, and arrangement of parts which are adapted to effect such steps, all as exemplified in the following detailed disclosure. The scope of the invention will be indicated in the claims.

For a fuller understanding of the nature and objects of the invention, reference should be had to the following detailed description taken in connection with the accompanying drawings.

BRIEF DESCRIPTION OF THE DRAWINGS

FIGS. 1A and 1B, in combination, are a right side elevation of FIG. 2, illustrating the cooperating interaction between most of the component parts of the instant invention.

FIG. 2 is a front elevation of the inserter of the instant invention.

FIG. 3 is a top plan view, with portions removed, as viewed generally in the direction of arrows 3—3 of FIG. 1a.

FIGS. 4 and 5 are partial views to illustrate a magnet bracket and sensor of a Hall effect switch.

FIG. 6 is a front elevation of the insert head assembly of the device of FIGS. 1a –1b.

FIG. 7 is a left side cross-sectional view, of FIG. 6.

FIG. 8 is a left side elevation of the device of FIG. 6, with portions thereof broken away for clarity.

FIG. 9 is a right side elevation of the device of FIG. 6, with portions thereof broken away for clarity.

FIG. 10 is a top plan view illustrating the positional arrangement of the transfer assembly, manual loaders and clip centering mechanism.

FIG. 11 is a partial cross-section, to illustrate the working structure of the clip centering mechanism.

FIG. 17 illustrates two- and three-lead electronic components processable by the method and apparatus of the instant invention.

DETAILED DESCRIPTION OF THE INVENTION

Figure 1A:
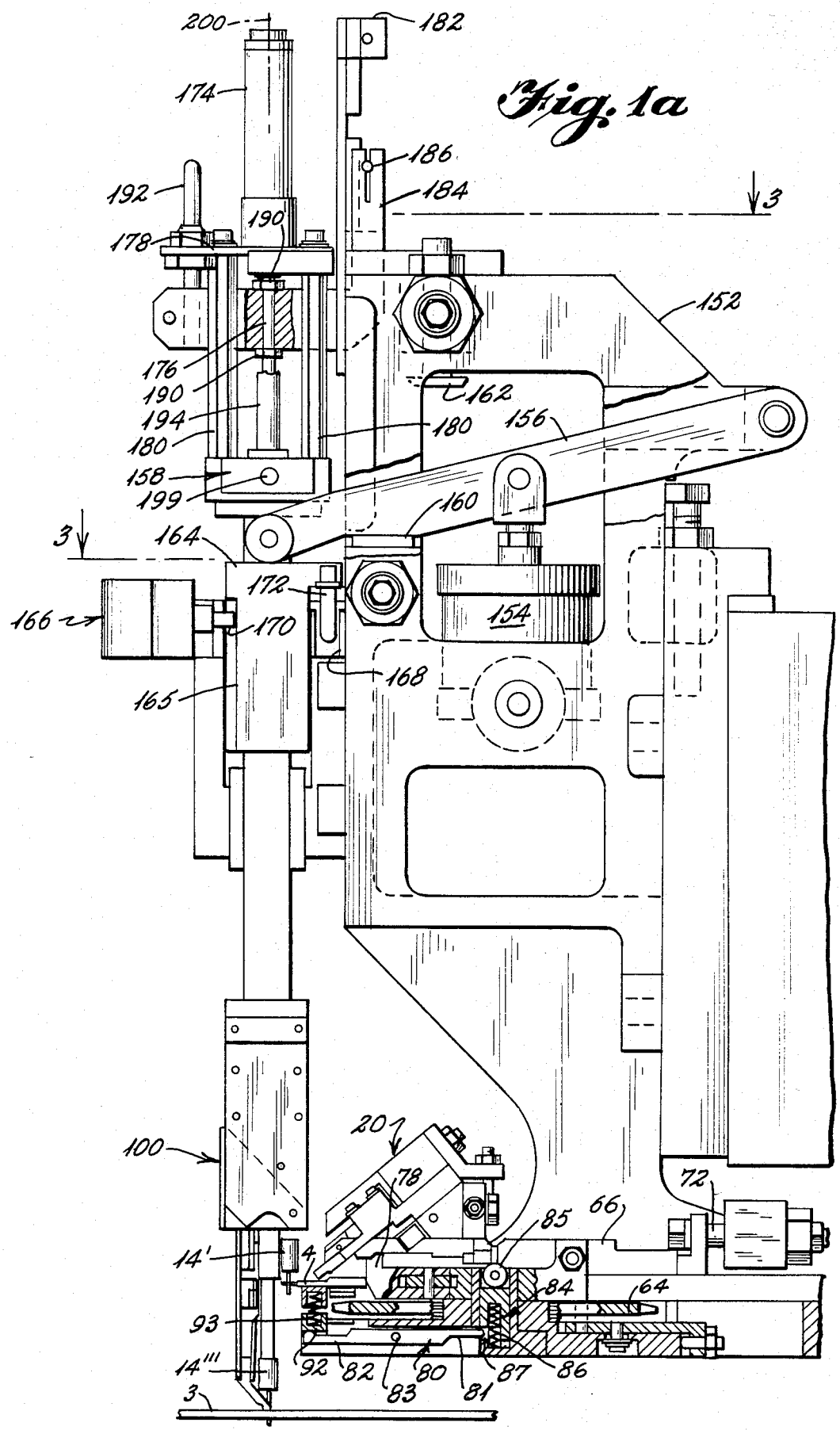

With reference to FIG. 1A–1B, transfer assembly 60 supports loader assembly 20 for transfer of an electronic component 14' from a conveyor—carried clip 4 and loading of component 14' into an insert head assembly 100. In FIG. 1A–1B, insert head assembly 100 is in its lowest position for insertion of the leads of a previously received component 14' into the holes of the circuit board 3. Main frame 152 supports a transfer assembly 60 and, ultimately, insert head assembly 100.

Referring to FIGS. 1A–1B and 2, main frame 152 supports a positioning assembly for vertical positioning of head assembly 100 along insert axis 200 and rotational orientation of head 100 about axis 200. Vertical positioning cylinder 154 is mounted on frame 152 for actuation of arm 156 which is pivotally attached at one end to frame 152. The other end of arm 156 is pivotally attached to bearing assembly 158 which, in turn, rotatably supports an orientor tube 164. Orientor tube 164 is connected to insert head assembly 100 so that rotation of orientor tube 164 about insert axis 200 will also rotate insert head 100 about the insert axis. Bearing assembly 158 is guided for vertical reciprocation along axis 200 by guide rods 194 which are attached to main frame 152. An insert cylinder 174 is attached to bearing assembly 158 by machine bolts and spacer tubes 180.

As will be appreciated, bearing assembly 158 allows rotation of orientor tube 164 and insert head assembly 100 about insert axis 200, without rotation of insert cylinder 174. As will be further appreciated, insert rod 176, actuated by insert cylinder 174, is extensible and retractable along insert axis 200 independently of vertical positioning of bearing assembly 158 by vertical positioning cylinder 154. Accordingly, the tooling of insert head 100 is actuatable by insert rod 176 (and extensions thereof) independently of the vertical displacement of insert head 100 by vertical positioning cylinder 154.

Separate sets of sensing devices are provided to sense the raising and the lowering of insert head 100 by vertical positioning cylinder 154 and the extension and retraction of insert rod 176 (and associated actuation of the tooling of insert head 100). Each of these sensing devices comprises a Hall effect switch having spaced sensors and a magnet for actuating the sensors. Referring to FIG. 2, sensors 196 and 198, respectively, are for sensing the UP and DOWN positions of insert head assembly 100 when magnet 199 (mounted on bearing assembly 158) is appropriately positioned opposite one of the sensors. Sensors 182 and 184, respectively, are for sensing the extended and retracted positions of insert rod 176 (Hall effect sensors 182 and 184 are best seen in FIGS. 1A–1B). Magnet 186 is mounted on a generally L-shaped bracket 188 which is attached to insert rod 176 by nuts 190. Bracket 188 is prevented from rotating about insert axis 200 by the provision of a guide rod 192, attached to bracket 188 and slidingly receivable in bracket 178 of insert cylinder 174, as best seen in FIGS. 1A–1B, 4, and 5.

Polyurethane bumpers 162 and 160 are adjustable vertically to define the upper and lower limits of travel of pivotal arm 156.

Orientor tube 164 is generally of the type disclosed in United States Pat. No. 4,343,589—Snyder, et al. (specifically FIG. 36 thereof), with the additional provision herein of a locater pin 172 attached to orientor tube 164. Locator pin 172 is engageable in one of three locater holes 168 (best seen in FIG. 3) of orientor actuator bracket 166. These holes 168 correspond to 0°, +90°, and −90° orientations of a component about insert axis 200.

Actuator bracket 166 contains three separate cylinders (not shown) for actuating respective shot pins 170 (one of which is shown in FIGS. 1A–1B) and engaging a selected shot pin 170 in one of three slots or grooves 165 in orientor tube 164, as in U.S. Pat. No. 4,343,589.

Locator pin 172 and locater holes 168 are provided in order to eliminate any orientation sloppiness which may be caused by loose tolerances and constant operation of the device.

FIG. 17 illustrates typical two- and three-lead components which are processable by the apparatus of the instant invention.

Figure 15:
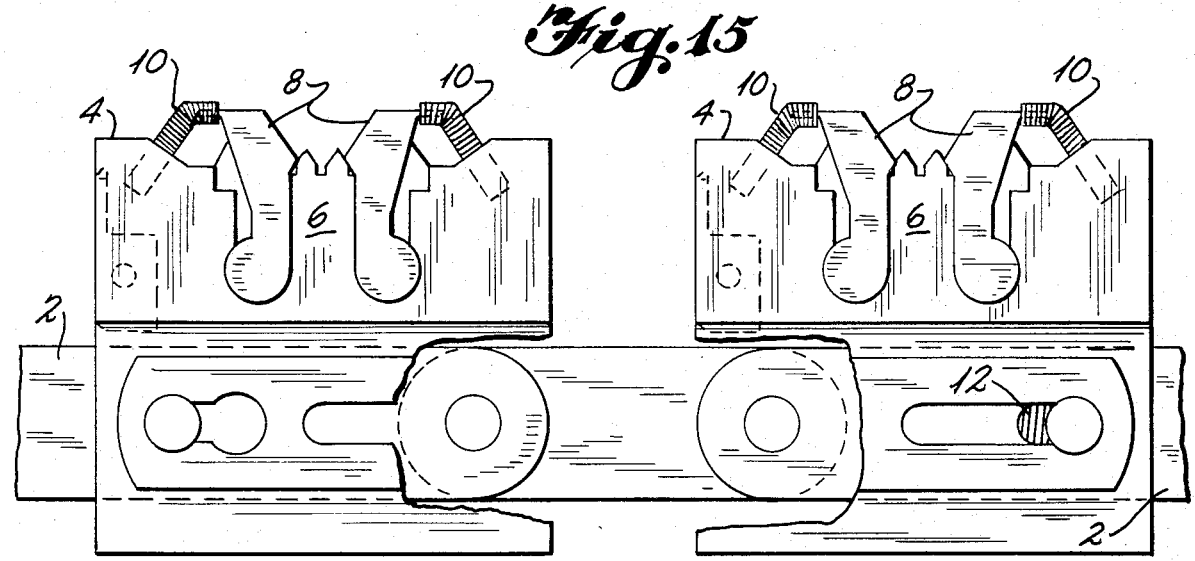
FIG. 15 is a top plan view illustrating component carrier clips mounted on a portion of a conveyor chain.
Figure 16:
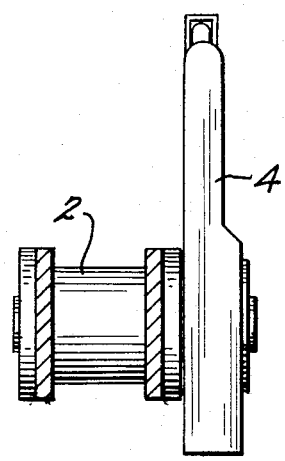
FIG. 16 is a left side elevation of the device of FIG. 15.

FIGS. 15 and 16 illustrate several component carrying clips 4 mounted on a conveyor-chain 2. Each clip 4 is mounted on chain 2 such that a small lateral displacement along chain 2, i.e., right and left as viewed in FIG. 15, is possible under the biasing of a loading spring 12. Such an ability for lateral displacement of clip 4 relative to chain 4 allows centering of clip 2 relative to loader 20 by a clip centering mechanism 90, as will be explained later. Each clip 4 has a fixed guide finger 6 and pivotal holding fingers 8 which are spring biased toward guide finger 6 by spring 10. With such an arrangement, the outer two leads of an electronic component are releasably held against guide finger 6 by pivotal holding fingers 8.

As may be seen by reference to FIGS. 1A–1B and 10, chain 2 passes around a sprocket 64 and is indexed to present a clip 4 (and component 14 releasably held thereby) to an unload station.

Referring to FIGS. 6–9, insert head assembly 100 comprises a main body 102 within which a slide ramp 128 is movable relative to body 102 along insert axis 200. Main body 102 supports a pivotal actuator 122 at pivot axis 127, with pivotal actuator 122 having lugs 124 and 126. Lug 126 is engageable in notch 131 of slide ramp 128 and Lug 124 is engageable in notch 116 of a guide jaw 104. Guide jaw 104 is appropriately supported and constrained such that it is displaceable toward and away from insert axis 200 along ramp 114 thereof.

Telescopically received within slide ramp 128 is an actuator rod 132 which, in turn, telescopically receives a plunger 136 which is biased to an extended position by compression spring 138. As may be seen from FIG. 6, outer jaws 106 cooperate with inner guide jaw 104 and are biased away from guide jaw 104 by compression spring 110. A clamp slide 118 slidingly fits to guide jaw 104 and has camming fingers 119 for engaging cams 108 on each outer clamping jaw 106. Accordingly, jaws 106 are closed upon guide jaw 104 when clamp slide 118 is in the retracted position to which it is biased by a compression spring 112 (FIG. 7).

As seen in FIG. 7, actuator rod 132 includes a lug 134 displaceable within slot 130 of slide ramp 128. With the tooling of head assembly 100 in the position illustrated, actuator rod 132 is extensible (downward as viewed in FIG. 7) and surface 120 of clamp slide 118 is engaged by actuator rod 132 approximately 1/16 of an inch before lug 134 of actuator rod 132 engages the bottom of slot 130 of ramp slide 128. Accordingly, camming fingers 119 of ramp slide 118 are moved away from cams 108 of outer jaws 106 such that compression spring 110 opens jaws 106. By continued downward movement of actuator rod 132, lug 134 drives slide ramp 128 downwardly such that pivotal actuator 122 is rotated about axis 127 and guide jaw 104 is displaced along ramp surface 114 by lug 124 of pivotal actuator 122. As explained earlier, actuator rod 132 is extended and retracted by insert cylinder rod 176 (seen in FIGS. 1A-1B and 2) and, upon retraction of actuator rod 132, lug 134 engages the upper end of slot 130 of slide ramp 128 and drives slide ramp 128 upwardly to cause reverse pivoting of pivotal actuator 122 and return of the tooling of insert head 100 to the positions generally indicated in FIG. 7.

Figure 12:
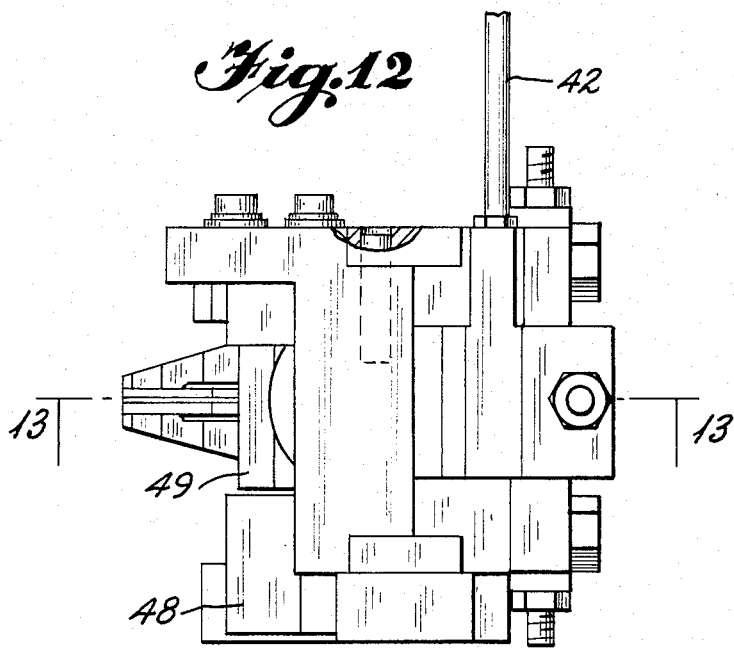
FIG. 12 is a top plan view of the loader assembly.
Figure 13:
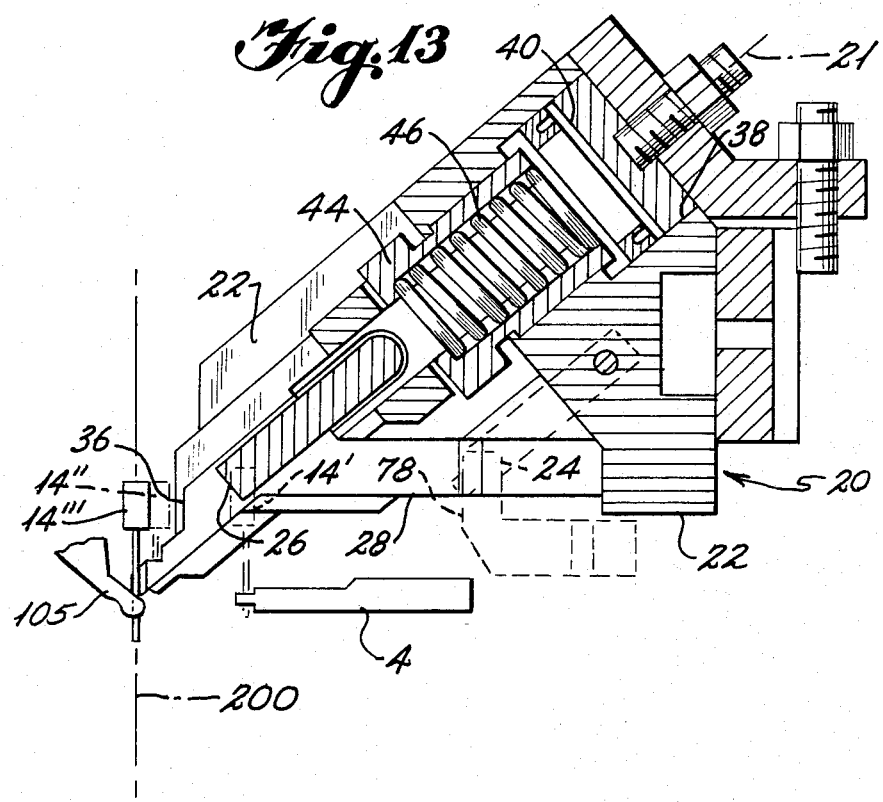
FIG. 13 is an enlarged cross-section, as viewed generally in the direction of arrows 13—13 of FIG. 12, but with the loader tooling in the extended position.
Figure 14:
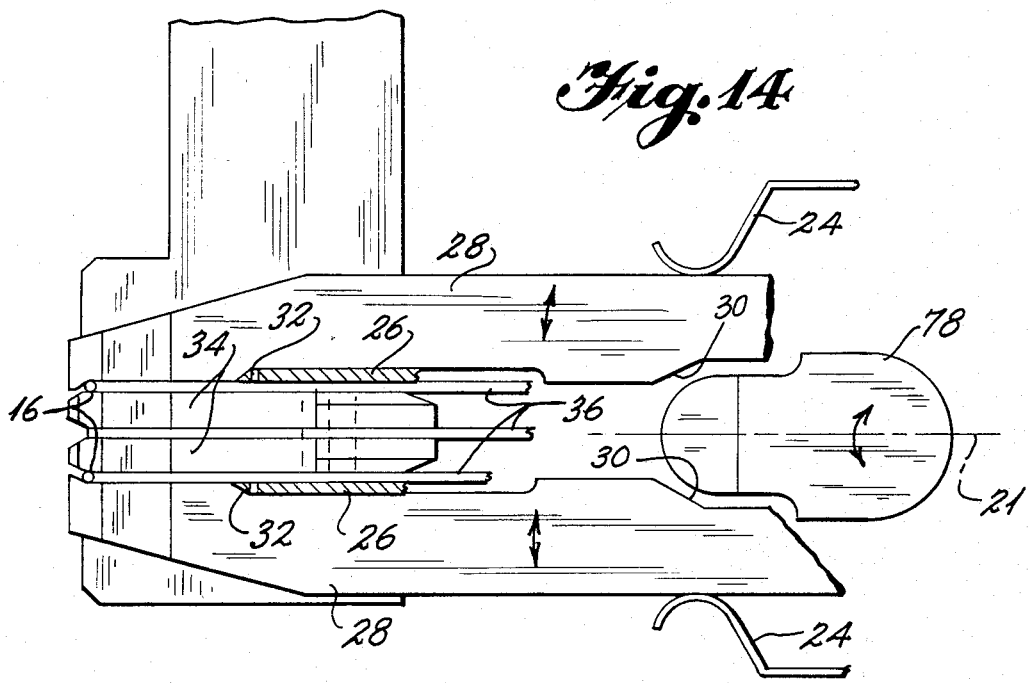
FIG. 14 is an enlarged, top plan schematic view of the loader tooling of FIG. 12.

The operating structure of loader assembly 20 may be seen in FIGS. 12-14, with FIG. 13 illustrating the tooling of loader assembly 20 in the extended position. Loader assembly 20 has a housing 22 relative to which a loader tooling is extensible and retractable along loader axis 21 by loader cylinder 38 and piston 40. The tooling of loader 20 which is reciprocable along axis 21 may be seen in FIG. 14 and comprises opener blades 26 and pusher blades 36. Clamping fingers 28 are slightly pivotal toward and away from an inner guide finger 34, as indicated by the arrows of FIG. 14.

Referring to FIGS. 1A-1B and 10, loader assembly 20 is mounted upon slide 68 of a transfer assembly 60 for reciprocation along a transfer axis 61. For clarity, FIG. 10 shows transfer assembly 60 without loader assembly 20 mounted thereon.

Transfer assembly 60 comprises a main body 62 rotatably supporting gear 64, about which conveyor chain 2 passes for movement of clip 4. Main body 62 also comprises ways or guides 66 along which slide block 68 is reciprocateable by actuation of transfer cylinder 70 and rod 72. Piston rod 72 extends all the way through cylinder 70 such that Hall effect sensors 74 and 76 may detect extension and retraction of slide 68 by magnets 75 and 77. Pivotally attached near the front of main body 62 is an opener knob 78 for engaging camming surfaces 30 (as seen in FIG. 14) of clamping fingers 28 when slide 68 is in the retracted position; opener knob 78 is pivotally attached to main body 62 of transfer assembly 60 in order that it will be selfcentering relative to camming surfaces 30.

Referring to FIGS. 1A-1B, it may be seen that main body 62 of transfer assembly 60 also contains a lever actuator 84 having a compression spring 86 biasing lever actuator 84 upwardly so that a roller 85 is engaged by slide 68, when in the extended position, to move actuator 84 downwardly against the biasing of spring 86. Actuator 84 also has a slot 87 within which the right end 81 of lever 80 is received such that lever 80 may pivot about pivot point 83 in concert with movement of actuator 84 up-and-down. The left end 82 of lever 80 engages the bottom of a centering arm table 92, which forms a portion of a clip centering mechanism 90.

For an understanding of the clip centering mechanism 90, reference should be had to FIGS. 1A-1B, 10, and 11. Table 92 is biased to the downward position into engagement with the left end of lever 80 by compression spring 93 and carries centering arms 94 by pivotal attachment at pivot point 95. Centering arms 94 have tips 97 which engage the sides of a clip 4 (as illustrated in phantom in FIG. 10) for centering of clip 4 relative to chain 2 and loader axis 21 against the bias of clip loading spring 12. Cam tracks 96 are provided in centering arms 94 to guide arms 94, as may be appreciated by reference to FIG. 11. A sensor 98 is provided to sense that centering mechanism 90 is down and centering arms 94 are below the bottom surface of a clip 4, so that indexing of chain 2 does not foul the centering mechanism.

Returning to FIGS. 1A-1B, and 12-14, retraction of loader assembly 20, to the right as viewed in FIGS. 1A-1B, causes engagement of cam surfaces 30 of clamping fingers 28 with opener knob 78 to open clamping fingers 28 for reception of a component 14' located at an unload station as seen in FIG. 1A-1B. While loader assembly 20 is in the position of FIG. 1A-1B, electronic component 14" is being inserted into circuit board 3 by insert head assembly 100, as also seen in FIG. 1A-1B. Having inserted component 14' into circuit board 3, the insert head assembly 100 is returned to the position of FIG. 13 for the reception of another component via loader assembly 20. Loader assembly 20 comprises a main body 22 having fixed guide fingers 34 and pivotal clamping fingers 28 attached thereto so that, upon moving loader assembly 20 to the left as viewed in FIG. 1A-1B, cam surfaces 30 of clamping fingers 28 will clear actuator knob 78 and close upon leads 16 of a component 14' which is releasably held in a carrier clip 4. Further movement of loader assembly 20 by transfer assembly 60 causes the component to be transfered to a load station, as illustrated in phantom as 14" in FIG. 13, so that loader cylinder 38 may be fired to drive the leads of the component out of fingers 28 and 34 and into the jaws of insert assembly 100. During transfer of the component from the position 14' to the position 14''' as seen in FIG. 13, leads 16 are clamped between clamping fingers 28, guide finger 34, and pusher rods 36. In order to drive the leads of the component into insert head 100, loader cylinder 38 must be fired to extend piston 40.

As indicated earlier, clamping fingers 28 are pivotally attached to main body 22 of loader assembly 20 and are biased to a closed position by leaf springs 24 (seen in FIGS. 13 and 14). Pusher blades 36 and opener blades 26 are attached to the rod of piston 40 so that, upon extension thereof, opener blades 26 engage camming surfaces 32 of clamping fingers 28 and pusher rods 36 drive the leads 16 of a component into the jaws of insert head assembly 100. As may be seen from FIG. 13, there is a slight overlap of the tooling of loader 20 and insert head assembly 100 prior to firing cylinder 38, such that the leads are in engagement with the tips 105 and 107 of the jaws of insert head 100 prior to being driven therein during firing of cylinder 38. Fluid is admitted to cylinder 38 through inlet 42 (seen in FIG. 12) in order to cause extension of piston 40, and retraction of piston 40 is accomplished by compression spring 46 upon removal of fluid pressure from cylinder 38. As also may be seen from FIG. 13, a plane defined by the outer leads 16 of component 14''' also contains insert axis 200 after the component has been driven into the jaws of insert head assembly 100.

Referring to FIG. 12, a Hall effect sensor 48 is attached to main body 22 of loader 20 and magnet 49 is attached for reciprocation with piston 40 to detect the retracted position of the loader tooling.

Figure 18:
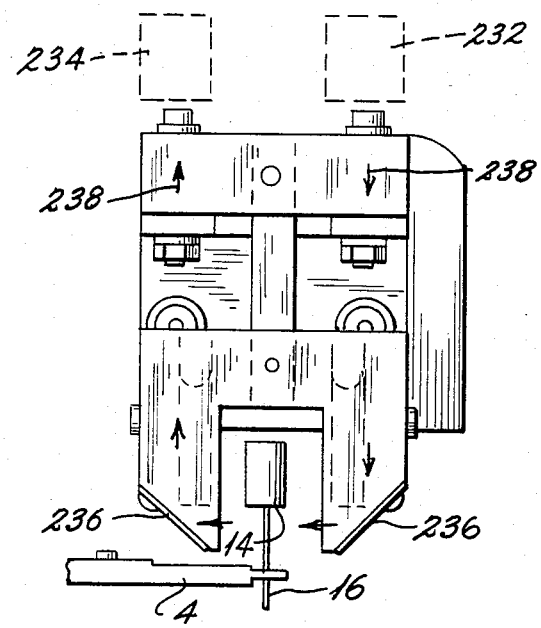
FIG. 18 is a front elevation of a part missing sensor.

FIG. 18 illustrates a part missing sensor mechanism 230 which, although not shown in any of the other figures, is arranged to straddle a component 14 which has been properly sequenced into a carrier clip 4, with part missing sensor 230 located at a position prior to the unload station when viewing the path of travel of conveyor chain 2. Part missing sensor 230 has a light transmitter 232 for projecting light along a direction indicated by arrows 238, with the projected light being directed by reflectors 236 back to a receiver 234. Light transmitter 232 is pulsed in concert with indexing of chain 2 such that light is transmitted as each clip 4 is straddled by mechanism 230. Accordingly, breaking of the light beam by the leads of a component indicates the presence of the component in clip 4. If the light has not been broken by the leads of the component, an alarm will notify the machine operator to manually load the appropriate component into the empty clip 4 before it arrives at the unload station.

Figure 19:
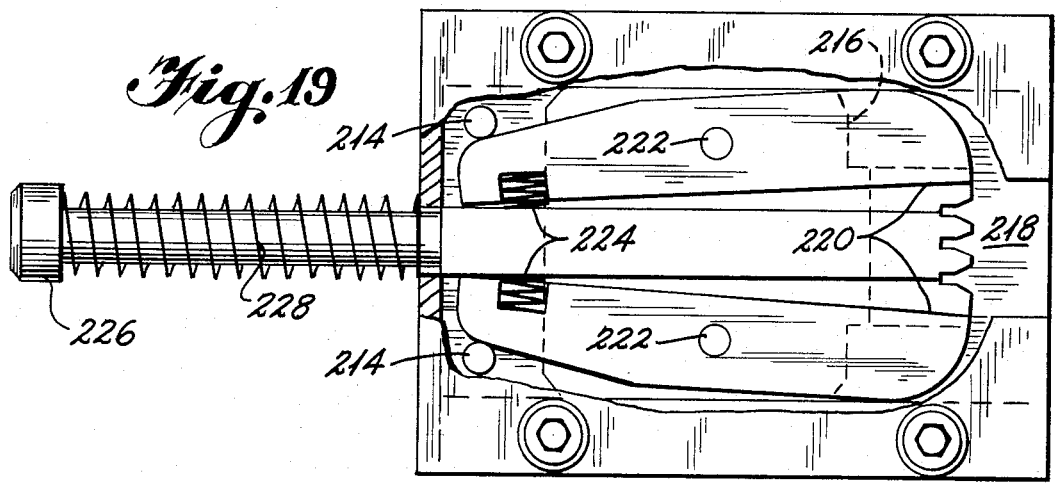
FIG. 19 is a top plan view, with portions thereof broken away for clarity, of a manual loader.
Figure 20:
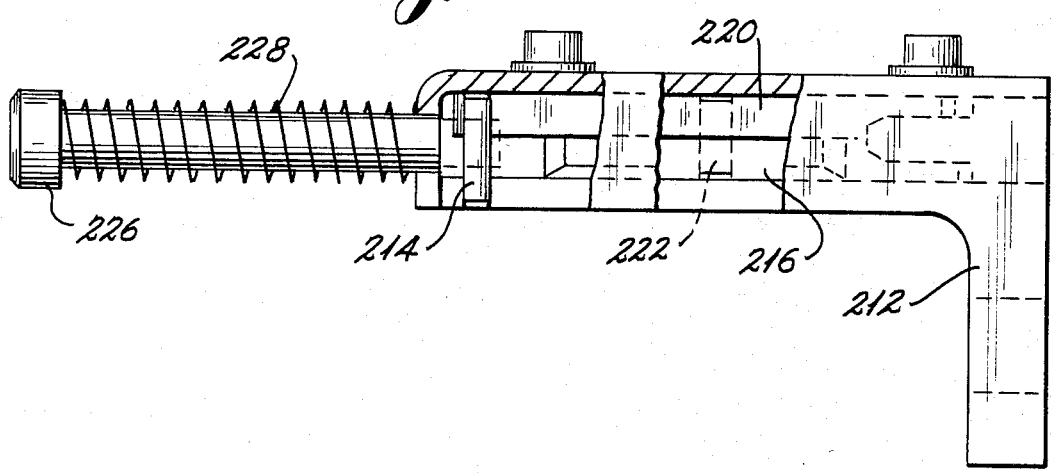
FIG. 20 is a front elevation of the device of FIG. 19, with portions thereof broken away for clarity.

In order to facilitate loading of an empty clip, the manual loader 210 of FIGS. 19 and 20 is provided. Manual loader 210 comprises a generally L-shaped bracket 212, attached to the transfer assembly main body 62, with camming pins 214 fitted to bracket 212. A hand plunger 226 is spring biased to the position of FIGS. 19 and 20 by compression spring 228 and is attached to a plunger plate 216. Plunger plate 216 comprises a guide jaw 218 and clamping jaws 220 pivotally attached thereto at pivot points 222. In the retracted position illustrated in FIGS. 19 and 20, clamping jaws 220 are opened under the influence of camming pins 214. A compression spring 224 causes clamping jaws 220 to cooperate with guide jaw 218 in clamping the leads of a component upon moving hand plunger 226 to the right as viewed in the figures.

GENERAL OPERATION OF THE APPARATUS

With transfer assembly 60 having retracted loader assembly 20 to the position of FIG. 1A–1B, but with insert head assembly 100 raised by vertical positioning cylinder 154 generally to the position illustrated in FIG. 13, transfer assembly 60 is actuated to extend slide 68, and loader assembly 20 mounted thereon, to the left as viewed in FIG. 1A–1B. Clip centering mechanism 90 centers clip 4 relative to loader 20 during extension of slide 68 and prior to loader 20 gripping the leads.

Thereafter, the leads of component 14' are gripped by loader assembly 20 and, with further extension of transfer assembly 60, the leads of component 14' are removed from clip 4 and engaged with insert jaw tips 105, 107. Having cleared the fingers of clip 4, loader assembly 20 is fired to extend the tooling thereof and drive the leads of the component into the jaws of insert assembly 100. Thereafter, the tooling of loader assembly 20 is retracted, transfer assembly 60 is actuated to retract loader assembly 20 along transfer assembly axis 61, and the appropriate shot pin 170 is fired into engagement with slot 165 of orientor tube 164.

At this time, vertical positioning cylinder 154 is caused to lower insert cylinder 174, orientor tube 164, and insert head assembly 100 along insert axis 200, during which time appropriate orientation about insert axis 200 is imparted to the component clamped in the jaws of insert head assembly 100. During this lowering, the leads of the component are started into the holes of the circuit board.

Next, insert cylinder 174 is fired to actuate the tooling of insert head assembly 100 so that the jaws thereof release the leads of the component while retracting upwardly and at an angle to insert axis 200, as defined by ramp surface 114 of insert head assembly 100; and spring biased plunger 136 drives the leads the rest of the way into the holes of the circuit board. Such an angular retraction of the tooling of insert head assembly 100 allows much closer population of electronic components onto a circuit board.

After reception of a component in the jaws of insert head assembly 100 and prior to lowering thereof by vertical positioning cylinder 154, the next component carrying clip 4 is indexed to the unload position and, with raising of insert assembly 100 after the insertion of a component, transfer assembly 60 is fired to unload a component from carrying clip 4 and prepare for firing of loader assembly 20 and subsequent loading of another component into insert head assembly 100.

If, during operation of the machine, part missing sensor mechanism 230 indicates that a carrier clip does not have a component, manual loader assembly 210 may be utilized to place the appropriate component into the empty carrier clip prior to its being presented to the unload station. Further, sensing of an improper insertion of the leads into the circuit board may be accomplished by a clinching and sensing mechanism (not shown), and a manual loader may be located on the downstream side of the unload station so that indexing of the chain may be halted and a component may be manually loaded into a carrying clip which has just passed the unload station. The chain drive may be reverse-indexed by one position to reposition this carrying clip back at the unload station for a repair function of the board, after which normal indexing may continue.

Although not specifically illustrated in the drawings, it is contemplated that pusher blades 36 may be pivotal relative to the rod of piston 40 so that the front ends thereof may be caused to lower and improve driving of the leads of the component into the jaws of the insert head. Further, it is contemplated that other means of causing the angular retraction of the tooling of the insert head assembly may be provided, for instance, a rotatable gear may replace pivotal actuator 124 with cooperating linear gear teeth located on the angular surface of slide ramp 128 and upon surface 114 of guide jaw 104.

It will thus be seen that the objects set forth above, among those made apparent from the preceding description, are efficiently attained and, since certain changes may be made in carrying out the above method and in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

Now that the invention has been described, what is claimed as new and desired to be secured by letters patent is:

1. A method of automated processing of components each having a body and leads depending from said body, said processing comprising transferring individual components sequentially from an unload station to a load station for subsequent populating of a circuit board by inserting said leads into holes of a circuit board with an inserter, said method for each component comprising the steps of:

presenting said component to said unload station by a clip means for releasably holding said component by leads at said unload station, at least two of said leads being generally parallel and generally defining a lead plane;

clamping at least two of said leads at said unload station by a loader during holding of said leads by said holding means;

transferring said loader in a direction generally perpendicular to said lead plane during said clamping to effect releasing of said leads and unloading of said component from said holding means and presenting of said component to said load station;

engaging at least two of said leads with said inserter at said load station during clamping of said leads by said loader; and unclamping said leads while driving at least two of said leads into an interference fit with said inserter to effect loading of said inserter.

2. A method as in claim 1, wherein said driving comprises:

pushing at least two of said leads and moving said component along a direction which is at an angle to said lead plane and to an insert axis of said inserter.

3. A method as in claim 1, wherein:

said unclamping and driving is effected by extending said loader toward said inserter.

4. A method as in claim 3, and further comprising the steps of:

retracting said loader away from said inserter; and
inserting said leads into said circuit board holes.

5. A method as in claim 1, and further comprising the step of:

shifting and aligning said component relative to said loader at said unload station prior to said clamping in order to situate said leads for said clamping.

6. A method as in claim 4, and further comprising the step of:

orienting said component by rotating said component about an insert axis of said inserter prior to said inserting.

7. A method as in claim 1, and further comprising the steps of:

gripping at least two of said leads by said interference fit in a gripper of said inserter such that an insert axis of said inserter is contained in said lead plane during said gripping;

moving said component toward said circuit board and starting tips of said leads into said circuit board holes during said gripping; and ungripping said leads and moving said gripper away from said leads at an angle to said lead plane while retracting said gripper away from said circuit board along said insert axis and further inserting said leads into said holes such that closer populating of said circuit board with said components is facilitated by reducing clearances required between adjacent components mounted in said circuit board.

8. An apparatus for automated processing of electrical components, each of said components having a body and leads depending from said body, said processing comprising transferring individual components sequentially from an unload station to a load station for subsequent populating of a circuit board by inserting said leads into holes of a circuit board with an inserter, said apparatus comprising:

clip means for presenting each component to said unload station and releasably holding said component by at least two of said leads at said unload station, at least two of said leads being generally parallel and generally defining a lead plane;

loader means, operatively associated with said presenting means, for clamping at least two of said leads at said unload station during holding of said leads by said presenting means;

transfer means, operatively associated with said loader means, for transferring said loader means in a direction generally perpendicular to said lead plane, during said clamping, in order to effect releasing of said leads and unloading of said component from said presenting means and presenting of said component to said load station;

means, operatively associated with said loader means, for engaging at least two of said leads with said inserter at said load station during clamping of said leads by said loader means; and means, operatively associated with said loader means, for unclamping said leads and driving said leads into an interference fit with said inserter to effect loading of said inserter.

9. An apparatus as in claim 8, wherein said unclamping and driving means comprises:

means for engaging said two leads and pushing said component along a direction which is at an angle to said lead plane and to an insert axis of said inserter.

10. An apparatus as in claim 8, and further comprising:

means, operatively associated with said loader means, for extending and retracting said unclamping and driving means along a direction which is angular to said insert axis and to said lead plane.

11. An apparatus as in claim 8, and further comprising:

means, operatively associated with said presenting means, for shifting and aligning said component relative to said loader means at said unload station prior to said clamping in order to situate said leads for said clamping.

12. An apparatus as in claim 8, and further comprising:

means, operatively associated with said inserter, means for orienting said component by rotating said component about an insert axis of said inserter prior to said inserting.

13. An apparatus as in claim 8, and further comprising:

means, operatively associated with said inserter, for gripping at least two of said leads by said interference fit in said inserter such that an insert axis of said inserter is contained in said lead plane during said gripping;

means, operatively associated with said inserter, for moving said component toward said circuit board and starting tips of said leads into said circuit board holes during said gripping;

means, operatively associated with said inserter, for ungripping said leads and moving said gripper means away from said leads at an angle to said lead plane while retracting said gripper away from said circuit board along said insert axis in order to reduce clearances required between adjacent components mounted on said circuit board and thus provide for closer population of said circuit board with said components; and means, operatively associated with said inserter, for further inserting said leads into said holes.

14. An apparatus as in claim 11, wherein said aligning means comprises:

means for engaging and aligning said presenting means, said engaging and aligning means being actuatable by movement of said transfer means.

* * * * *